United States Patent [19]

Borel et al.

[11] Patent Number: 4,857,161

[45] Date of Patent: Aug. 15, 1989

[54] PROCESS FOR THE PRODUCTION OF A DISPLAY MEANS BY CATHODOLUMINESCENCE EXCITED BY FIELD EMISSION

[75] Inventors: Michel Borel, Le Touvet; Jean-Francois Boronat, Grenoble; Robert Meyer, St Ismier; Philippe Rambaud, Grenoble, all of France

[73] Assignee: Commissariat a l'Energie Atomique, Paris, France

[21] Appl. No.: 1,159

[22] Filed: Jan. 7, 1987

[30] Foreign Application Priority Data

Jan. 24, 1986 [FR] France ................................ 8601024

[51] Int. Cl.[4] .......................... C23C 14/00; B05D 5/06

[52] U.S. Cl. .......................... 204/192.26; 204/192.15; 427/64; 313/309

[58] Field of Search .................. 427/64; 313/309, 336, 313/351, 355, 463; 156/643, 644; 204/192.1, 192.15, 192.26

[56] References Cited

U.S. PATENT DOCUMENTS

| | | | |
|---|---|---|---|
| 3,453,478 | 7/1969 | Shoulders et al. | 313/336 |
| 3,755,704 | 8/1973 | Spindt et al. | 313/309 |
| 3,998,678 | 12/1976 | Fulcase et al. | 156/3 |
| 4,008,412 | 2/1977 | Yuito et al. | 313/309 |
| 4,485,158 | 11/1984 | Harper | 427/64 |
| 4,513,308 | 4/1985 | Greene et al. | 357/55 |
| 4,657,843 | 4/1987 | Fukuyama et al. | 156/643 |

FOREIGN PATENT DOCUMENTS

| | | |
|---|---|---|
| 0172089 | 2/1986 | European Pat. Off. . |
| 3340777 | 5/1985 | Fed. Rep. of Germany . |
| 2536889 | 6/1984 | France . |

OTHER PUBLICATIONS

Spindt, C. A. "A Thin-Film Field-Emission Cathode" J. Applied Physics vol. 39, No. 7 (1968) pp. 3504-3505.

*Primary Examiner*—John F. Niebling
*Assistant Examiner*—Steven P. Marquis

[57] ABSTRACT

A process of producing a display operating by cathodoluminescence excited by field emission, including forming parallel cathodes on a glass substrate, depositing a silica coating on the cathodes, then a conductive coating and then producing a matrix of holes in the conductive coating and silica coating, depositing on the perforated conductive coating a fourth coating not covering the holes and then depositing on the complete structure a coating of an electron emitting material, eliminating the fourth coating so as to expose the microemitters, forming in the conductive coating grids crossing the cathodes and placing above the grids an anode covered by a cathodoluminescent coating.

11 Claims, 4 Drawing Sheets

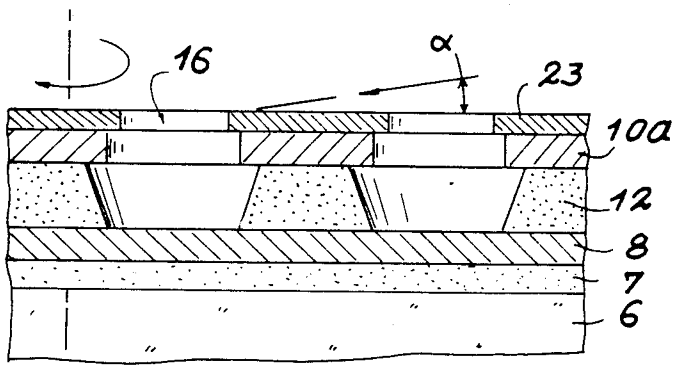
FIG. 7
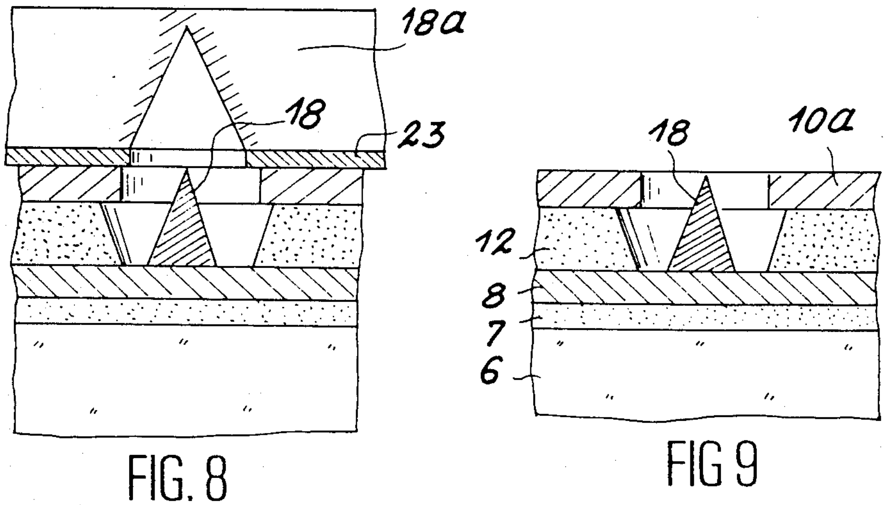
FIG. 8
FIG 9
FIG. 12
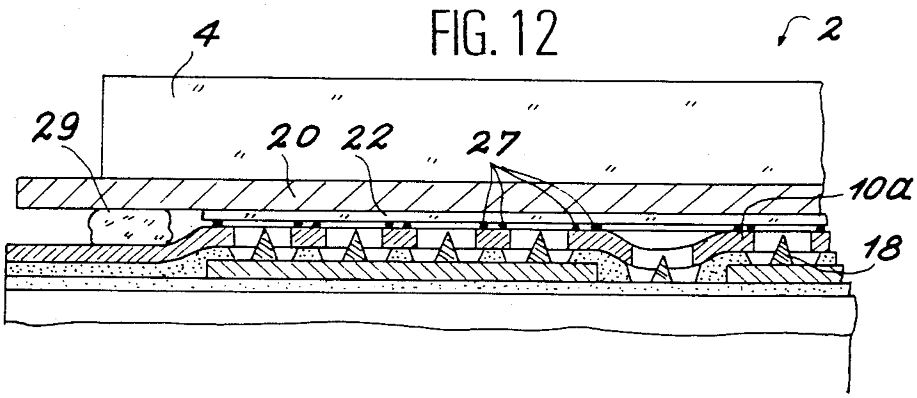

PROCESS FOR THE PRODUCTION OF A DISPLAY MEANS BY CATHODOLUMINESCENCE EXCITED BY FIELD EMISSION

BACKGROUND OF THE INVENTION

The present invention relates to a process for producing a display means by cathodoluminescence excited by field emission or cold emission. It particularly applies to the production of simple matrix displays making it possible to display fixed images or pictures and the production of multiplexed complex screens making it possible to display animated pictures, such as television pictures.

A display means by cathodoluminescence excited by field emission is described in French patent application 84 11986 of July 27 1984 filed in the name of the Applicant. In FIG. 1 is shown an exploded perspective view of the display means described in this document.

The display means comprises a display cell 2, which is tight and placed under vacuum, having two facing glass walls 4, 6. The lower wall 6 of cell 2 is equipped with a first series of parallel conductive strips 8 serving as cathodes and a second series of parallel conductive strips 10 serving as grids. The conductive strips 10 are oriented perpendicular to conductive strips 8 and are insulated from the latter by a continuous insulating coating 12, more particularly of silica.

The end regions 9 of the cathodes 8 not covered by an insulant and not intercepting the grids 10 permit electric contacting on the cathodes.

Conductive strips 8, 10 respectively represent the columns and rows. An elementary display point 14 corresponds to each intersection of a row and column.

The conductive strips or grids 10 and the insulating layer 12 are perforated by a large number of holes 16, which house the electron microguns or microemitters. A plurality of microemitters corresponds to each elementary display point 14.

As shown in FIG. 2, these microemitters are in each case constituted by a metal cone 18 emitting electrons, when an appropriate electric field is applied thereto. These metal cones 18 rest by their base directly on cathodes 8 and the apex of the cones is substantially level with the conductive strips 10. The base diameter of the cones and the height thereof are e.g. approximately 1 μm.

The upper wall 4 of cell 2, as shown in FIG. 1, is provided with a continuous conductive coating 20 serving as the anode. Anode 20 is covered by a coating 22 made from a light emitting material when subject to electrode bombardment from microemitters 18.

The emission of electrons by a microemitter 18 can be brought about by simultaneously polarizing cathode 8 and grids 10, which face one another, as well as anode 20. Anode 20 can in particular be grounded, the grids 10 being raised to the potential of the anode or negatively polarized with respect thereto by means of a voltage source 24. Cathodes 8 are negatively polarized or biased with respect to the grid using a voltage source 26. Cathodes 8 and grids 10 can be sequentially polarized in order to bring about a point-by-point image on the display cell 2. The image is observed from the side of the upper wall 4 of the cell.

The number of microemitters 18 per display point 14, i.e. per intersection of a cathode and a grid is generally high, which makes it possible to have a more uniform emission characteristic between display points (mean value effect). This leads to a certain redundancy of the microemitters, so that it is possible to accept a certain proportion of non-functioning microemitters.

In practice, the number of microemitters is between $10^4$ and $10^5$ emitters per $mm^2$. Therefore conventional production requiring a precise positioning of the emitters placing the cathodes and grids would be complex and would increase the cost of the display means.

SUMMARY OF THE INVENTION

The present invention relates to a relatively simple and not onerous process making it possible to produce a display means operating by cathodoluminescence excited by the field effect, as described hereinbefore.

More specifically, the present invention relates to a process for the production of a display means by cathodoluminescence comprising the successive stages of depositing a first conductive coating on an insulating substrate, etching the first coating to form first parallel conductive strips serving as cathodes, depositing a second insulating coating on the structure obtained, depositing a third conductive coating on the second coating, making holes issuing into the third and second coatings, said holes being distributed over the entire surface of the third and second coatings, depositing on the third etched coating a fourth coating not covering the holes, depositing on the complete structure obtained a fifth coating of an electron emitting material, eliminating the fourth coating leading to elimination of the electron emitting material surmounting said fourth coating and maintaining said emitting material in the holes, etching third and second coatings to expose at least one of the ends of the first conductive strips, etching the third coating to form second parallel conductive strips serving as grids, the first and second strips intersecting and producing a facing anode and cathodoluminescent material from the second conductive strips.

The expression "holes distributed over the complete surface" is understood to mean holes made facing the cathodes and also facing the-intercathode gaps.

This process has the advantage of simple performance. In particular, it makes it possible to produce electron microemitters in the holes formed in the second and third coatings distributed over the entire display means without requiring a precise positioning with respect to the cathodes and grids. Only the microemitters located at an intersection of a cathode and a grid are effectively active.

In order to improve the adhesion of the cathode conductors on the insulating substrate, between substrate and first conductive coating, in which the cathodes are formed, is advantageously placed an insulating intermediate coating.

In order to minimize the access resistances to the microemitters, the first conductive coating must be made from a good electricity conducting material. Moreover, said first conductive coating must have a good compatibility with the second insulating coating and in particular a good adhesion and must be inert with respect to the etching method of said second insulating coating. Advantageously, the first conductive coating is made from a material chosen from among indium (II) oxide, tin dioxide and aluminum.

The indium (II) oxide and the tin dioxide are preferably used for producing small screens with a limited complexity , such as those used for the display of fixed images or pictures. Conversely, aluminum is used in preferred manner when producing multiplexed, large complex screens used more particularly for displaying animated pictures e.g. of the television type.

In order to minimize capacitances between the cathodes and the grids and therefore minimize the response time of the microemitters, the second insulating coating must have a minimum dielectric constant. For this purpose, said second insulating coating is preferably made from silicon dioxide ($SiO_2$) or silica.

This silicon dioxide coating can be deposited by chemical vapour phase deposition, cathodic sputtering or vacuum evaporation. However, preference is given to the use of chemical vapour phase deposition, which makes it possible to obtain an oxide coating having a homogeneous quality and a constant thickness.

The formation of the holes in the insulating coating, particularly of silicon dioxide can be brought about by known wet or dry etching methods.

The third conductive coating in which the grids are formed must be made from a material having a good adhesion to the second insulating coating, e.g. silicon dioxide, as well as a good chemical resistance to the different products used for producing the microemitters. For this purpose, the third conductive coating is preferably made from a metal chosen from among niobium, tantalum and aluminum.

In order to obtain holes in said third conductive coating in reproducible manner and of a size of approximately 1 micron, the formation of said holes is advantageously brought about by anisotropic dry etching.

In order to ensure a good definition of the microemitters, the fourth coating serving as a mask for the deposition of the fifth coating is made from a metal and in particular nickel. The deposition of this fourth nickel coating is advantageously brought about by vacuum evaporation under a glancing incidence, so as to not cover the holes made in the second and third coatings. Moreover, said metal coating is advantageously eliminated by electrochemical dissolving.

The choice of material of the fifth coating is largely dictated by its properties with respect to the emission by field effect or cold emission, as well as its chemical resistance to the methods used in depositing and eliminating the fourth coating for producing the microemitters. In particular, the electron emitting material can be hafnium, niobium, molybdenum zirconium, lanthanum hexaboride ($LaB_6$) titanium carbide, tantalum carbide, hafnium carbide, zirconium carbide, etc. For example molybdenum is chosen.

BRIEF DESCRIPTION OF THE DRAWINGS

The invention is described in greater detail hereinafter relative to non-limitative embodiments and the attached drawings, wherein show:

FIGS. 3 to 12, the different stages of the inventive process, FIGS. 3 to 6 and 10 to 12 being general views and FIGS. 7 to 9 larger-scale views showing a microemitter.

DETAILED DESCRIPTION OF THE PREFERRED EMBODIMENTS

Figure 1:
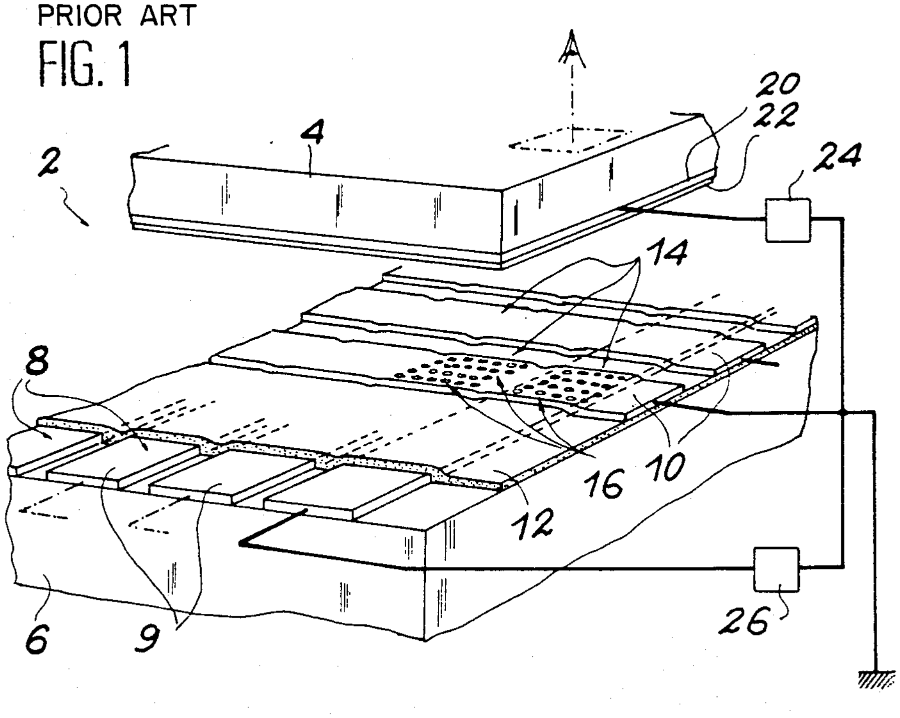
PRIOR ART FIG. 1
FIG. 1, already described, diagrammatically, in perspective and exploded form a cathodoluminescence display means.
Figure 2:
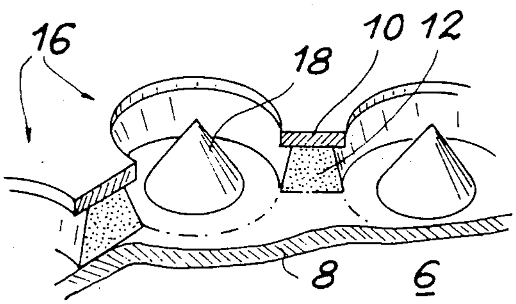
PRIOR ART FIG. 2
FIG. 2, already described, a larger-scale part of FIG. 1 showing a microemitter.
Figure 3:
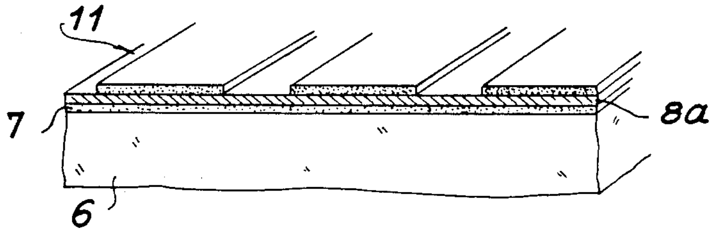

With reference to FIG. 3, the lower substrate 6 is firstly cleaned in order to obtain a good planeity and surface state to permit an optimized production of the microemitters. Substrate 6 can be a ceramic or glass plate. On substrate 6 is then deposited by cathodic sputtering a silicon dioxide coating 7 with a thickness of approximately 100 nm. Insulating coating 7 is covered by an indium (II) oxide conductive coating 8*a* and in it will be formed cathodes 8. Coating 8*a* has a thickness of 160 nm and can be deposited by cathodic sputtering.

Figure 4:
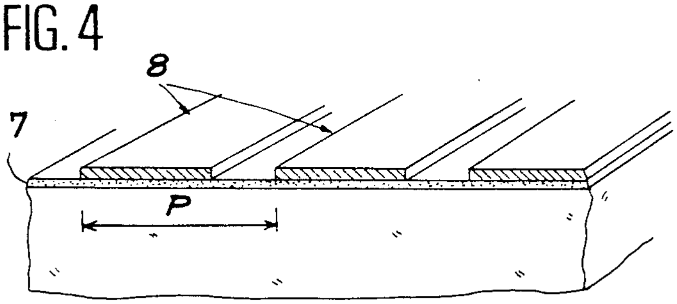

Using conventional photolithography processes (deposition, irradiation, development), a positive resin mask 11 representing the image of the cathodes to be produced is then formed. Through mask 11 is etched the indium (II) oxide coating 8*a* to form, as shown in FIG. 4, 0.7 mm wide cathodes 8 with a spacing P of 1 mm. Coating 8*a* is chemically etched using orthophosphoric acid heated to 110° C. The indium (II) oxide coating 8*a* is etched through the entire coating thickness. This is followed by the elimination of the resin mask by chemical dissolving.

Figure 5:
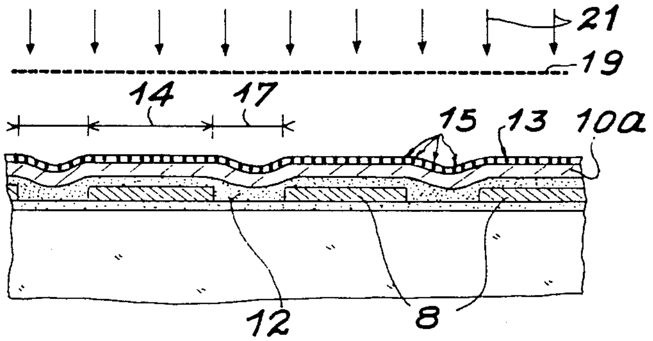

On the thus obtained structure, i.e. on cathodes 8 and the exposed regions of insulating coating 7 are then deposited, as shown in FIG. 5, silicon dioxide coating 12 using the chemical vapour phase deposition method on the basis of oxygen, phosphine and silane gases. Oxide coating 12 has a thickness of 1 $\mu$m. Oxide coating 12 is then completely covered with a conductive coating 10*a* in which will subsequently be formed the grids. Coating 10*a* is deposited by vacuum evaporation, has a thickness of $\mu$0.4 $\mu$m and is made from niobium.

On conductive coating 10*a* is then formed a resin mask 13 using conventional photolithography processes (deposition of resin, irradiation, development). Resin mask 13 represents the positive image of the holes to be produced in grid coating 10*a* and insulating coating 12.

According to the invention there is no need for precise positioning of these holes, in view of the large number thereof. In addition, a resin mask 13 is produced having openings 15 distributed over the entire mask surface and in particular in the regions 17 outside the zones 14 reserved for display purposes (elementary display points defined at the intersections of the cathodes and grids), which facilitates the production of the photomask 19 used for irradiation 21 of resin 13, as well as its position above the structure.

Figure 6:
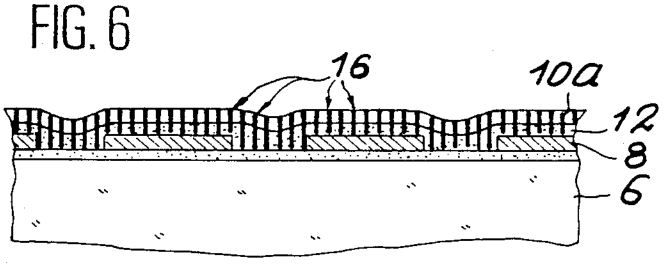

Through the resin mask 13 in FIG. 6 is then formed the holes 16 in the grid material coating 10*a* and insulating coating 12. These holes 16 completely traverse coatings 10*a* and 12. Etching of coatings 10*a* and 12 takes place successively. The etching of coating 10*a* is performed by a reactive ionic etching process using a sulphur hexafluoride ($SF_6$) plasma. The holes 16 made in conductive coating 10*a* have a diameter of $1.3 \pm 0.1$ $\mu$m. The holes are formed in silica coating 12 e.g. by chemical etching by immersing the structure in a hexafluoric acid and ammonium fluoride etching solution, followed by the chemical elimination of the resin mask 13. The profile of the thus obtained holes 16 is shown in FIG. 7.

A description will now be given of the production process for a microemitter. On coating 10*a* perforated by holes 16 is firstly deposited a nickel coating 23 by vacuum evaporation under a glancing incidence with respect to the surface of the structure. The angle $\alpha$ formed between the evaporation axis and the structure of coating 10*a* is close to 15°. The nickel coating 23 has a thickness of 150 nm. This deposition method ensures that the holes 16 do not become blocked.

As shown in FIG. 8, this is followed by the deposition of a molybdenum coating 18*a* on the complete structure and which has a thickness of 1.8 $\mu$m. It is deposited under normal incidence with respect to the surface of the structure. This deposition method makes it possible to obtain molybdenum cones 18 located in holes 16 having a height of 1.2 to 1.5 μm. This is followed by the selective dissolving of the nickel coating 23 by an electrochemical process so as to free, as shown n FIG. 9, the perforated niobium coating 10*a* and bring about the appearance of electron emitting micropoints 18.

Figure 10:
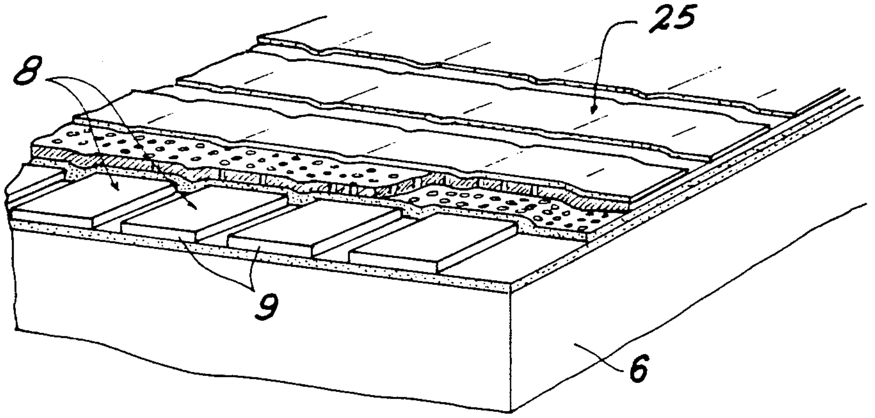

As shown in FIG. 10, this is followed by etching of coating 10*a* and etching of insulating coating 12, in order to free the ends 9 of cathodes 8 to subsequently permit electric contacting on these cathodes. This etching is performed through a not shown resin mask, obtained according to conventional photolithography processes, the resin forming the mask having to have a sufficiently high viscosity to cover all the holes 16 formed in niobium coating 10*a* and the silicon dioxide coating 12. The niobium coating 10*a* is etched, as hereinbefore, by a reactive ionic etching process and the silica coating 12 is etched chemically.

Figure 11:
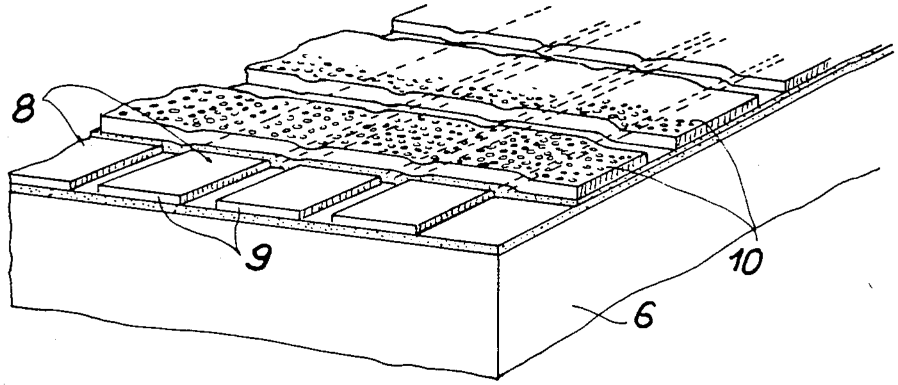

This is followed by the production of a resin mask 25 on the structure obtained and representing the image of the grids 10 to be produced in niobium coating 10*a*. This resin mask is produced by conventional photolithography methods. Through the mask 25 dry etching of the reactive ionic type then takes place with $SF_6$, in order to free the conductive strips 10 perpendicular to conductive strips 8. This is followed by the elimination of resin makk 25 by chemical etching. The structure obtained after eliminating mask 25 is shown in FIG. 11.

As shown in FIG. 12, on a glass substrate 4 is brought about the deposition of a conductive coating 20 of indium (II) oxide ($In_2O_3$) or tin dioxide ($SnO_2$) by cathodic sputtering corresponding to the anode of display cell 2. Coating 20 has a thickness of approximately 100 nm. Anode 20 is then covered with a cathodoluminescent coating 22 by cathodic sputtering. Coating 22 is of zinc oxide and has a thickness of 1 μm.

Substrate 4 covered by anode 20 and cathodoluminescent material 22 is then placed above grids 10. A space of 30 to 50 μm is maintained between cathodoluminescent material 22 and grids 10 by means of randomly distributed glass spacers 27. The periphery of anode 20 is hermetically welded to the bottom part of the cell by means of fusible glass 29. The assembly obtained is then placed under vacuum.

The above description has obviously not been given in a limitative manner and any modification can be made thereto without passing beyond the scope of the invention. In particular, the thickness and nature of the coatings can be modified. Moreover, certain etching processes and deposition methods can be changed.

The different stages of the process according to the invention have the advantage of being simple to perform and can be readily mastered by the expert, which permits a good reproducibility and homogeneity in the obtaining of the display means. Moreover, as the emitters are produced in the complete cell without precise positioning with respect to the cathodes and grids, it is possible to produce the display means particularly easily.

What is claimed is:

1. A process of producing a display means by cathodoluminescence comprising the successive steps of:
   (a) depositing a first, conductive coating on an insulating substrate,
   (b) etching the first coating to form first parallel conductive strips serving as cathodes,
   (c) depositing a second, insulating coating on the structure obtained in step (b),
   (d) depositing a third, conductive coating on the second coating,
   (e) making holes through the third and second coatings, said holes being distributed over the entire surface of the third and second coatings,
   (f) depositing on the third coating a fourth coating not covering the holes,
   (g) depositing on the structure obtained in step (f) a fifth coating of an electron emitting material,
   (h) eliminating the fourth coating to thereby eliminate the electron emitting material surmounting said fourth coating and maintaining said emitting material in the holes,
   (i) etching the third and second coatings to expose at least one of the ends of the first conductive strips,
   (j) etching the third coating to form second parallel conductive strips serving as grids intersecting the first strips, without regard to location of the holes, and
   (k) placing a facing anode and cathodoluminescent material on the second conductive strips.

2. A production process according to claim 1 wherein an insulating intermediate coating is placed between the substrate and the first coating.

3. A production process according to claim 1, wherein the first coating is made from a material selected from the group consisting of indium (ii) oxide, tin dioxide, and aluminum.

4. A production process according to claim 1, wherein the second coating is of silicon dioxide ($SiO_2$).

5. A production process according to claim 1, wherein the second coating is deposited by chemical vapour phase deposition.

6. A production process according to claim 1, wherein the third coating is made from a metal selected from the group consisting of niobium, tantalum and aluminum.

7. A production process according to claim 1, wherein the holes are formed in the third coating by anisotropic dry etching.

8. A production process according to claim 1, wherein the fourth coating is made from nickel and wherein said fourth coating is eliminated by electrochemical dissolving.

9. A production process according to claim 1, wherein the fourth coating is deposited by vacuum evaporation under a glancing incidence with respect to the surface of the structure.

10. A production process according to claim 1, wherein the fifth coating is obtained by vacuum evaporation of molybdenum.

11. A production process according to claim 1, wherein the anode is formed from a continuous conductive coating, covered with a continuous cathodoluminescent material coating, the anode being deposited on a transparent insulating support.

* * * * *